June 8, 1965 F. L. WILLIAMS 3,188,524

HIGH DENSITY CIRCUIT CARD PACKAGING

Filed Sept. 20, 1962 6 Sheets-Sheet 1

FRANCIS L. WILLIAMS
INVENTOR.

BY George C. Sullivan
AGENT

FRANCIS L. WILLIAMS
INVENTOR.

BY George C. Sullivan
AGENT

FRANCIS L. WILLIAMS
INVENTOR.

BY George C. Sullivan
AGENT

FRANCIS L. WILLIAMS
INVENTOR.

BY George C. Sullivan
AGENT

FRANCIS L. WILLIAMS
INVENTOR.
BY George C. Sullivan
AGENT

June 8, 1965 F. L. WILLIAMS 3,188,524

HIGH DENSITY CIRCUIT CARD PACKAGING

Filed Sept. 20, 1962

6 Sheets-Sheet 6

FRANCIS L. WILLIAMS
INVENTOR.

BY George C. Sullivan
AGENT

United States Patent Office 3,188,524
Patented June 8, 1965

3,188,524
HIGH DENSITY CIRCUIT CARD PACKAGING
Francis L. Williams, Sunnyvale, Calif., assignor to Lockheed Aircraft Corporation, Burbank, Calif.
Filed Sept. 20, 1962, Ser. No. 224,949
3 Claims. (Cl. 317—101)

The present invention relates in general to high density printed circuit card packaging, and in particular to a novel gate structure for mounting printed circuit cards, connectors, and associated wiring adaptable for complex electronic systems using high density printed circuit card packaging, regardless of the size or complexity of the circuit requirements.

Heretofore, in an electronic system utilizing high density printed circuit card packaging, the printed circuit cards were mounted within the electronic enclosure cabinet frame assembly of the electronic system such as to be readily accessible for easy removal and replacement. However, the connectors and wiring thereof were generally accessible only through the rear of the cabinet. In order to reach the connectors and wiring, the electronic equipment stored behind the circuit cards had to be shut down and removed, or the area behind the circuit cards was left empty, resulting in wasted space.

The basic concept of the present invention is a novel gate assembly designed to carry the highest possible number of printed circuit cards thereon, and at the same time, to provide free and complete access to both the printed circuit cards positioned on one side, and the circuit card connectors and wiring, on the other side of the gate, without the necessity of equipment disassembly or interruption of operation. Also, the initial mounting of the electronic components of the gate assembly may be accomplished on a work bench, and then the completed gate is mounted in the electronic system cabinet.

The prime object of the present invention is to provide a standardized high density printed circuit card packaging gate structure which allows complete access to the printed circuit cards and the circuit card connectors and wiring, and is readily adaptable to any electronic enclosure cabinet frame structure being designed or built, without the necessity for redesigning the packaging system and cabinet frame structure for each new system.

A further object of the present invention is to provide a high density printed circuit card gate assembly which provides complete access to the circuit cards, connectors, and wiring, without interrupting operation of the electronic equipment or disassembly thereof.

Another object of the present invention is the provision whereby a second circuit card gate can be mounted on a first gate, thereby forming a two-gate assembly.

Another object of the present invention is to provide a novel tape connector assembly for electrically interconnecting the two gates forming a two-gate assembly.

Another object of the present invention is the provision of a novel bus bar for providing a plurality of voltages to the card connectors.

These and other objects and features of the present invention will become apparent upon a perusal of the following specifications and drawings, of which:

Figure 12:
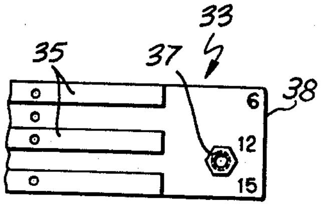
Figure 13:
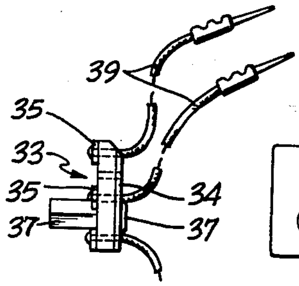
Figure 14:
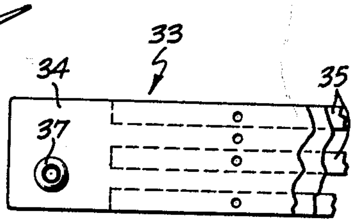

FIGURES 12, 13, and 14 are views of a bus bar, and

Figure 15:
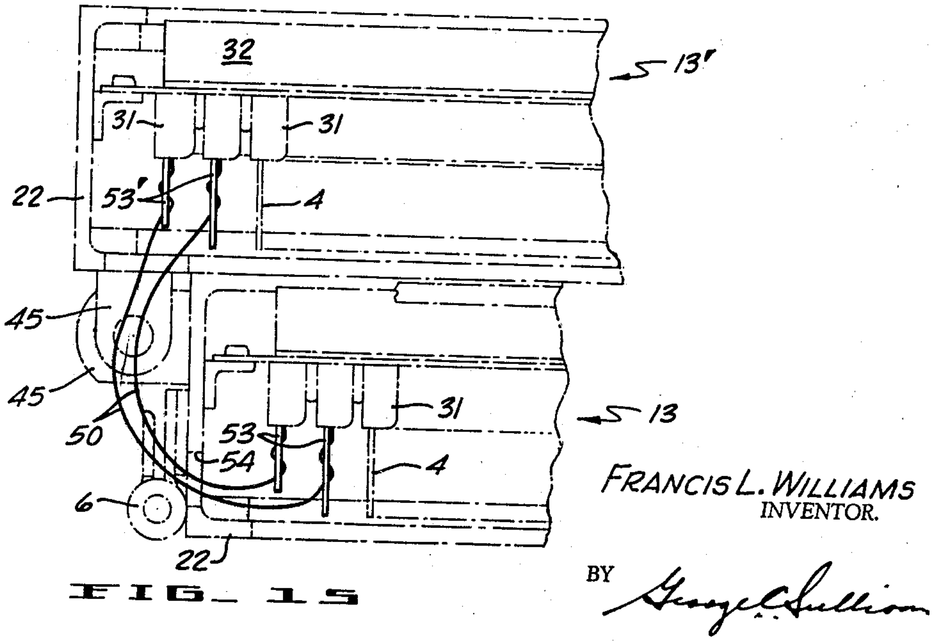

FIGURE 15 is an enlarged view, partially broken away, of a two-gate system tape interconnector.

Like components are designed by the same reference numerals throughout.

Figure 1:
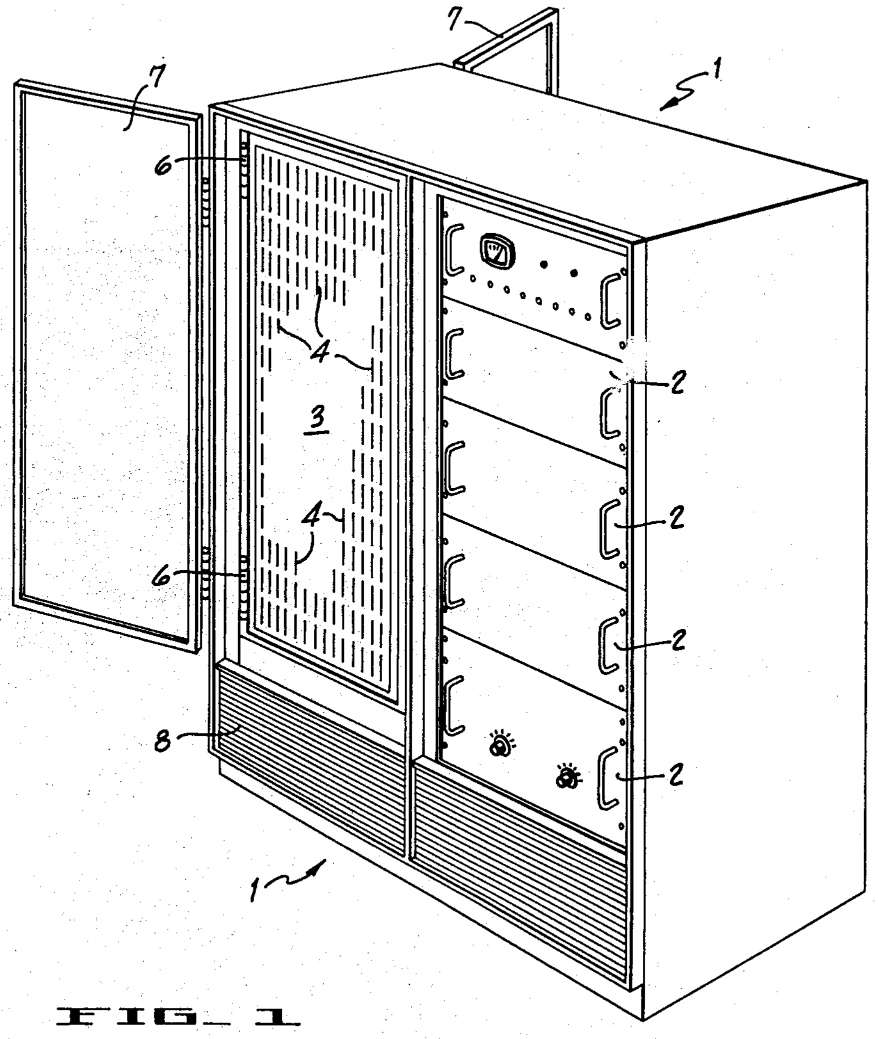
FIGURE 1 is a perspective view of an electronic cabinet showing the gates mounted on one side thereof.

Referring now the drawings, FIGURE 1 is a typical electronic enclosed cabinet frame 1 comprising a large metal frame structure of, for example, aluminum, in which various electronic chassis 2 are mounted in the right bay thereof. In the left bay of cabinet 1 is mounted a high density circuit card packaging gate 3 in which a great number of printed circuit cards 4 are mounted. Gate 3 is mounted in cabinet 1 by hinges 6 secured to gate 3 and the frame of cabinet 1. Convenient metal dust cover plates 7 are hinge-mounted on cabinet frame 1 to provide a dust cover for circuit cards 4. Positioned along the bottom of cabinet frame 1 are a plurality of horizontally directed metal strips 8 which protect a standard fine wire mesh air filter which covers an air intake of a cooling system (not shown) provided to maintain proper operating temperatures for the electronic components mounted on gate 3.

Figure 2:
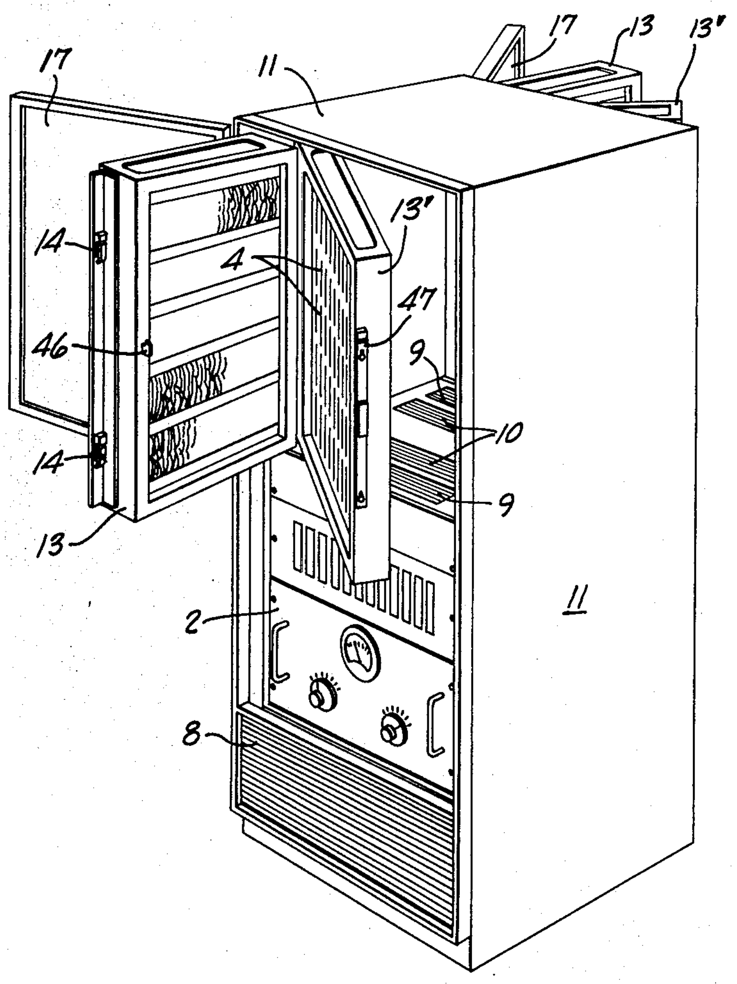
FIGURE 2 is a perspective view of an alternative electronic complex in which a pair of two-gate assemblies are mounted above the electronic equipment.

FIGURE 2 is another typical enclosed electronics cabinet frame structure smaller than FIGURE 1, comprising metal cabinet frame 11 which houses an electronic chassis 2 in the lower bay thereof. In the upper bay of cabinet frame 11 are mounted a pair of two-gate circuit card assemblies comprising front gates 13 and back gates 13'. The term "back" refers to inside in relation to the front gate. A pair of plunger gate lock receptacles (not shown) are secured to the metal frame, positioned such as to mate with plungers 14 of a plunger lock secured to the gate 13 to lock the gate assembly to the cabinet 11. Gate latch 47, secured to back gate 13' is provided to latch the two gates together before they are swung into the cabinet.

Any combination of single gate and/or double gate systems is possible in accordance with the present invention and all using substantially the same type of gate. For example, a single gate and a two-gate system could be provided in one bay of the same cabinet, or a pair of two-gate systems as shown in FIGURE 2 could be used. The gates may be either left-hand or right-hand hinged as desired. One difference in gates is the number of rows of circuit cards 4 to be provided therein. For example, gate 3 of FIGURE 1 has 15 levels of circuit cards, a typical level containing 20 circuit cards, giving a total of 300 circuit cards mounted in gate 3. The number of card levels may be changed as desired to give the number of circuit cards required.

In order to provide adequate air cooling for the circuit cards 4 and components mounted on each gate, the gates 13 and 13', as seen in FIGURE 2, have been designed so that there will be an interflow chimney between the inside surface of the cabinet front panel 17 and the plane formed by the front surface of the circuit card connectors. For example, the air moves from the bottom of the chamber in cabinet 11 where an air blower is located and passes through air vents 9 along the full length of both sides of the circuit cards 4 before being exhausted at the top of the cabinet through an output air vent (not shown). A second air chimney space is formed between the back surface of the front gate assembly 13 and the plane formed by the front of the circuit card connectors in the back gate assembly 13′, the air flow here passing through vents 10 through the second chimney and out via the output air vent.

Figure 3:
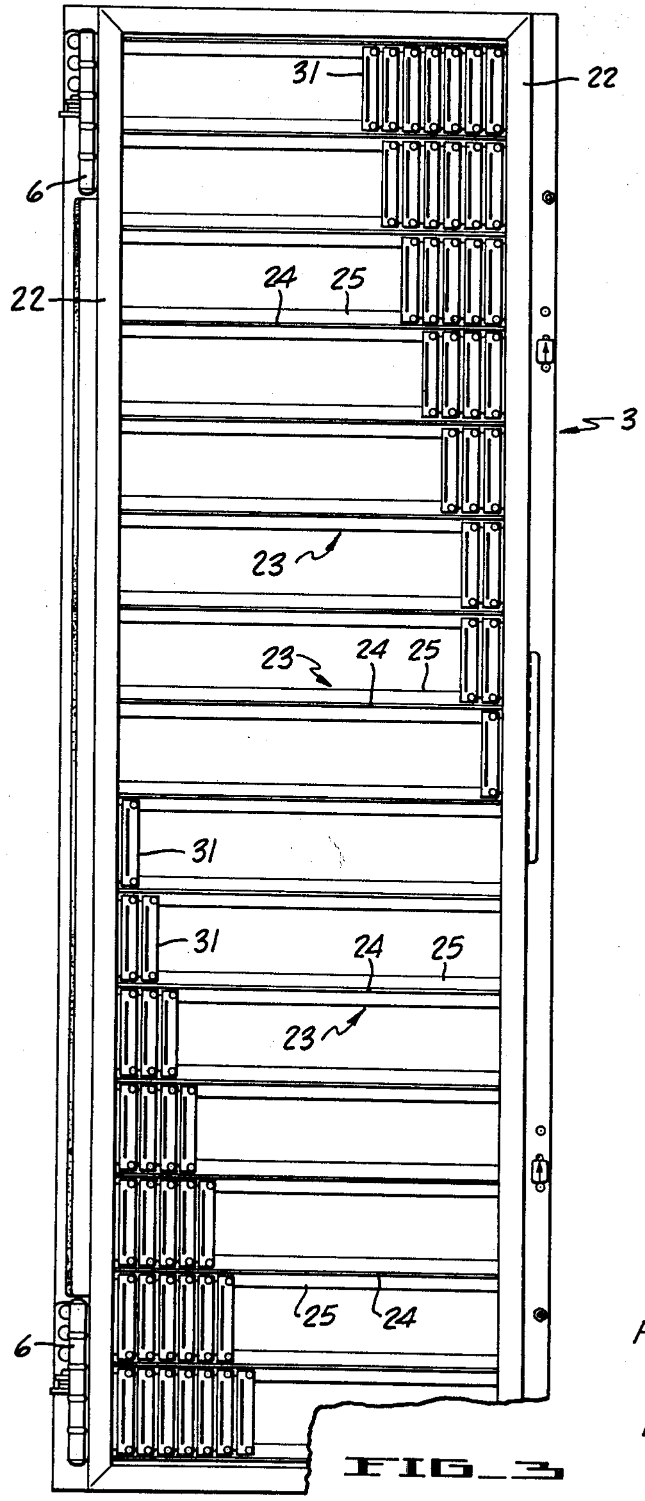
FIGURE 3 is a front view of a gate assembly.
Figure 4:
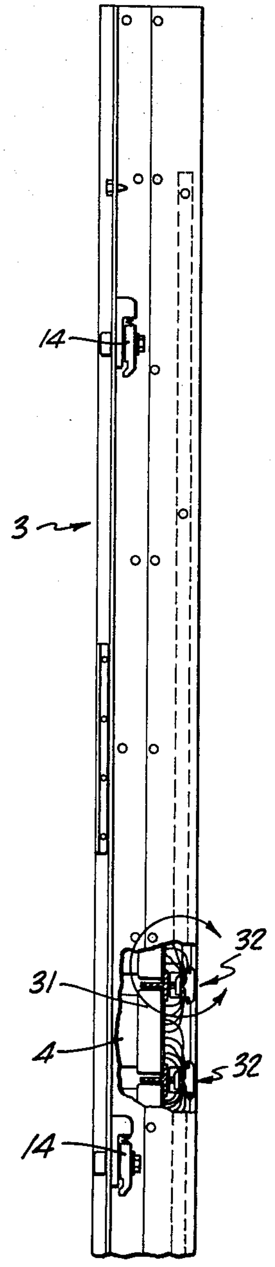
FIGURE 4 is a right side view of FIGURE 3 partially broken away.
Figure 11:
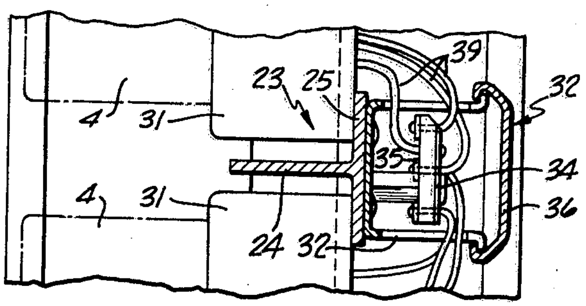
FIGURE 11 is an enlarged view of FIGURE 4 encircled by lines 11—11.

Referring now to FIGURES 3–7 inclusive, a high density circuit card gate 3 of the type shown in FIGURE 1 is shown in detail. The gates 3, whether a single gate assembly or the front or rear gate of a two-gate assembly, are substantially similar, the main differences being in various locks and hinges for mounting the gates, and the side of the gate upon which the hinges and locks are mounted and the length of the gates. These differences will be pointed out in describing a two-gate system. A gate 3 comprises two pair of mutually opposing channeled members 22 made of, for example, aluminum, secured together at the corners to form a solid frame, as by welding. A plurality of laterally directed T-bars 23 as of, for example, aluminum, are supported from the side pair of channel members and are positioned in a parallel relationship with each other and the top and bottom channel members 22. T-bars 23 (as best seen in FIGURES 3 and 11) are mounted on brackets 28 as, for example, by nuts and bolts 29. Brackets 28 are secured as by welding to frame members 22. The T-bars 23 are mounted such that the stem portion 24 thereof faces the front of the gate, while the bar portion 25 of the T faces the rear. The number of T-bars utilized will depend upon the length of each gate.

A plurality of circuit card connectors 31 are mounted on the front side of the bar 25 of the T-bars 23, each card connector 31 extending between adjacent T-bars 23. In this manner, each bar 25 of T-bar 23 supports two rows of circuit card connectors, one on either side of stem 24 which acts as a divider between adjacent rows of circuit card connectors 31 except the top and bottom T-bars 23 which support only one row of connectors.

A plurality of wiring ducts 32 are mounted on the back side of each T-bar 23. Wiring ducts 32 are substantially the same length as T-bars 23, and are supported thereon by any desired means. Disposed in the base of each wiring duct 32 is a horizontal bus bar 33 which is substantially the same length as ducts 32 and is secured thereto by nuts and bolts 37. A convenient snap-on dust cover 36 may be provided for each wiring duct 32.

Bus bar 33 (as best seen in FIGURES 12–14) comprises a laminated plastic sheet 38, one outer surface 34 thereof copper clad and serving as a common ground connection for each of the circuit card connectors 31. The other surface of the laminated plastic sheet 38 contains three longitudinally directed, spaced apart, copper strips 35 which are insulated from each other and serve as voltage input leads for the circuit cards. The copper strips 35 may be supplied with different voltage sources as so desired. Copper strip 35 and inner copper surface 34 may be provided with a plurality of lead wires 39, one for each card connector per copper strip, for easy connection to the circuit card connectors 31.

A pair of hinges 6 are mounted on either of the side frame members 22 by any convenient means to provide a means for hanging the gate on the cabinet. Mounted on the opposite side of gate frame 22 from the hinges 6 are secured a pair of spring loaded automatic plunger locks 14 for locking the gate assembly into both receptacles on the cabinet (not shown). Hinges 6 and plunger locks 14 could be interchanged, thereby providing for either a right-handed or a left-handed hinged gate member.

Figure 5:
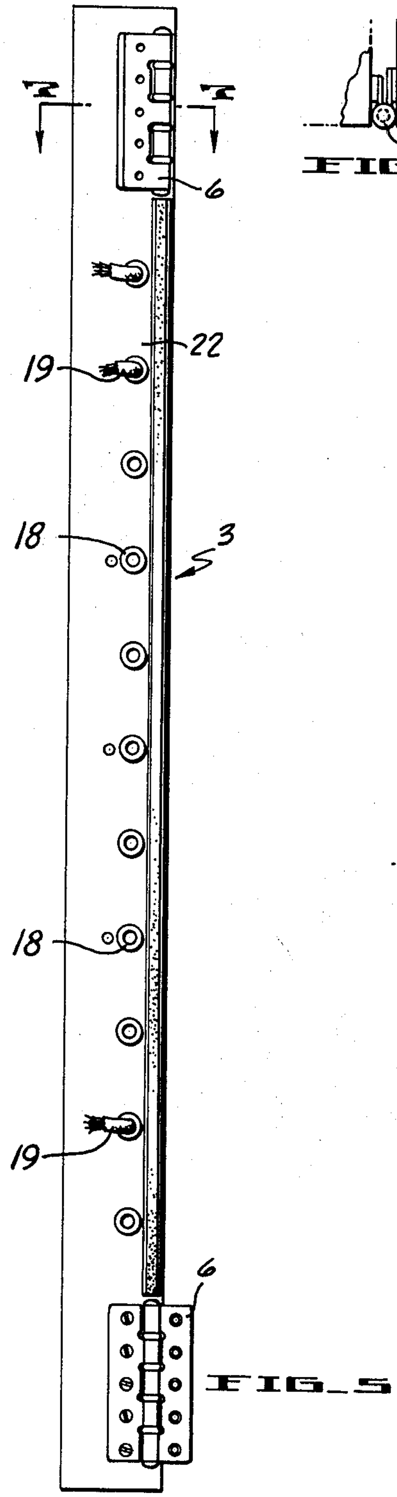
FIGURE 5 is a left side view of FIGURE 3.
Figure 6:
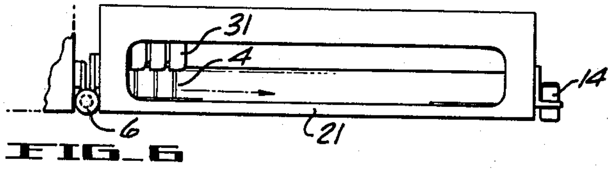
FIGURE 6 is a top view of FIGURE 3.
Figure 7:
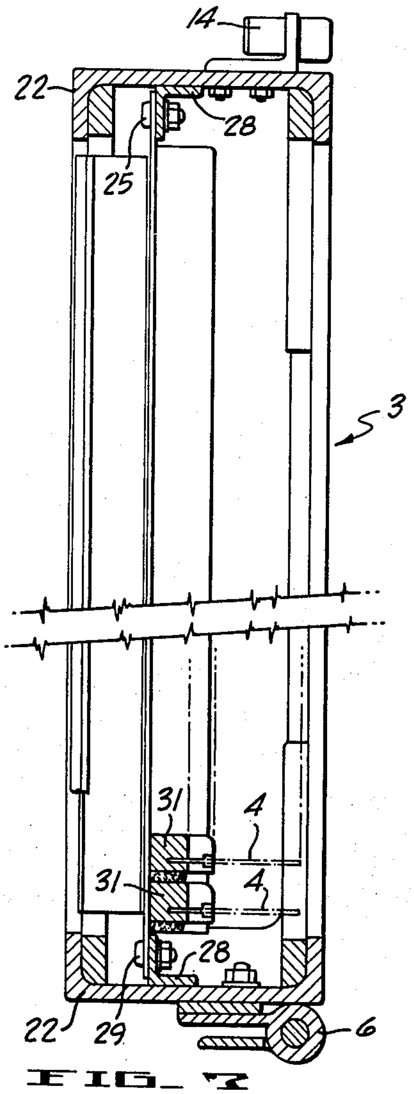
FIGURE 7 is an enlarged view of FIGURE 5 taken along line 7—7 in the direction of the arrows.

In a single gate unit as best seen in FIGURE 5, a plurality of circular grommeted holes 18 are positioned in a side channel 22 along the hinged side of each gate adjacent to each wiring duct 32. Connector wires 19 from each wiring duct would pass through its associated grommet hole 18 for electrical connection to the electronic components of the cabinet.

Referring now to FIGURES 8–10 and 15, a two-gate assembly of the type shown in FIGURE 2 is shown. The two-gate assembly comprises front gate 13 and back gate 13′. Both the gates are substantially similar to gate 3 of FIGURES 3–7. Back gate 13′ is hinge-mounted on front gate 13 and is offset slightly toward the hinged side of front gate 13. On the hinged side of front gate 13, positioned slightly behind the hinges 6 are mounted a pair of pintle hinge halves 45. A second pair of the pintle hinge halves 45′ are mounted on the front of the back gate 13′, on the extreme left hand side, and are positioned such as to mate with the hinge halves 45 mounted on front gate 13. It is noted that if the front gate 13 were hinged on the opposite side from that depicted in FIGURE 6, the pintle hinge halves 45 would be also positioned on the opposite side.

Mounted on the back side of the front gate 13, on the plunger lock side thereof, is positioned a spring gate latch 46, adaptable to receive a gate latch assembly 47 mounted on the side of the back gate 13′, the gate latch assembly being provided so that the front and back gate 13 and 13′ may be opened together as a single unit.

Figure 8:
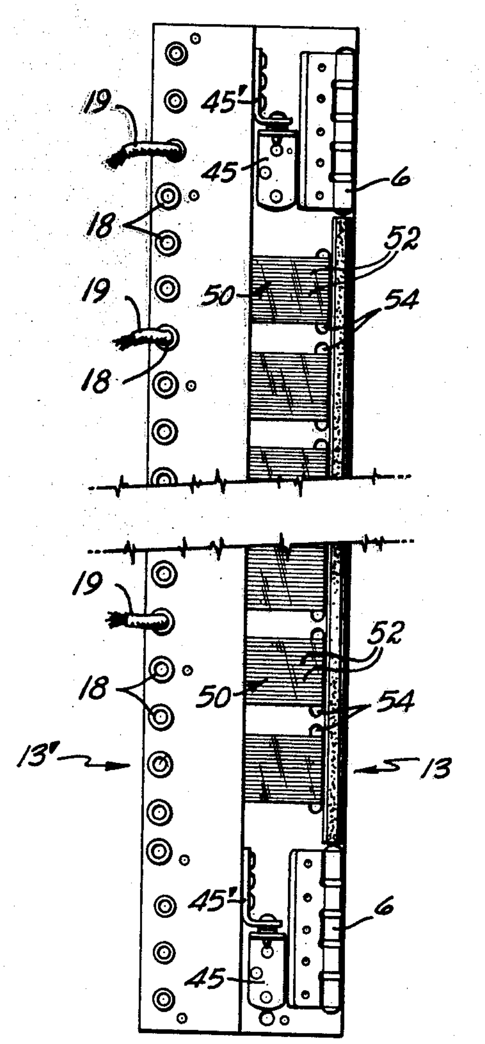
FIGURE 8 is a foreshortened left side view of a two-gate assembly.
Figure 9:
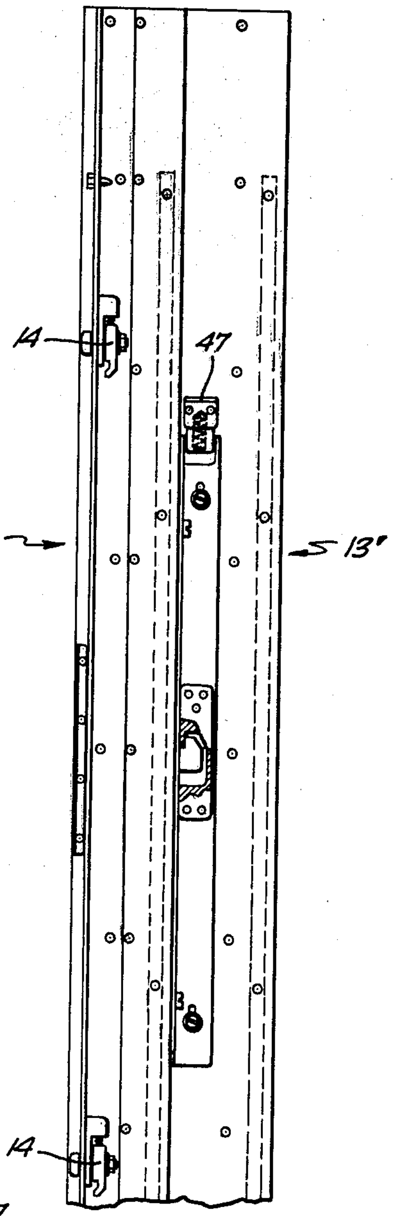
FIGURE 9 is a foreshortened right side view of a two-gate assembly.
Figure 10:
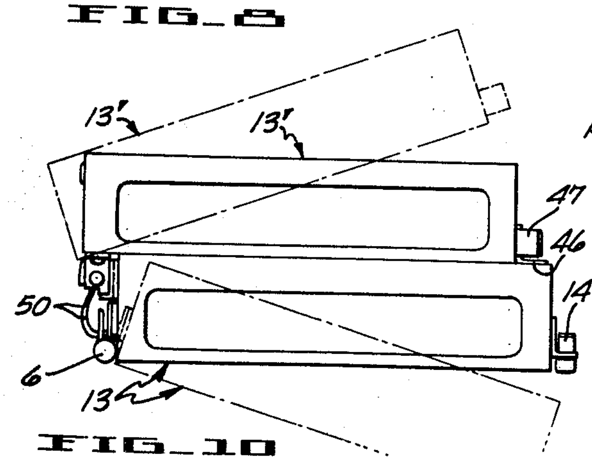
FIGURE 10 is a top view of a two-gate assembly showing the gates in open position in phantom.

In a two-gate assembly, it may be necessary to provide means for electrically interconnecting a front and a back gate. To accomplish this, a plurality of flexible tape gate interconnectors 50, as best seen in FIGURES 8 and 15, are provided. Tape interconnectors 50 comprise a plurality of thin, flat narrow copper conductors 52 embedded in a thin flat teflon strip, the teflon strip being wide enough to accommodate the necessary number of copper conductors. Flexible interconnectors 50 are terminated by cards 53 and 53′ adapted to be received by circuit card connectors adjacent the hinged side of the gate frame. Interconnectors 50 are threaded through the elongated apertures 54 provided in the hinged side frame member of front gate 13. The gate overlap between front and back gates provides a space for easy entry of interconnectors 50 from the front gate 13 into the back gate 13′.

It is noted that the initial wiring of the individual gates may be easily accomplished by removing the gates from their cabinets, thereby enabling technicians to install the wiring, etc., on convenient workbenches.

As the gate may be of various heights, each gate can accommodate, for example, up to 300 cards, since up to five gates may be mounted in a standard electronic enclosure. One housing has a maximum circuit card capacity of about 1500 cards.

What has been shown is a versatile, novel packaging system which allows for a high density of circuit cards to be mounted therein and provides easy access to the cards and their associated wiring and connectors.

It is to be understood in connection with this invention that the embodiments shown are only exemplary, and that various modifications can be made in construction and arrangement within the scope of the invention as defined in the appended claims.

What is claimed is:

1. In electronic enclosure cabinet frame assembly, means for mounting printed circuit cards, said means including a first and a second gate, a plurality of connectors secured to said gates for mounting said printed circuit cards thereon, hinge means secured on said first gate for movably mounting both first and second gates within said frame assembly, means secured to said first and second gates for movably mounting said second gate on said first gate, flat, flexible interconnection means connecting between said first and second gates to provide electrical interconnection therebetween, said second gate is offset in relation to said first gate in the direction of the hinge to provide unobstructed access for said interconnection means between said first and second gates.

2. The assembly according in claim 1 wherein each of said first and second gates comprises two pair of opposing frame members connected to form a substantially rectangular frame, a plurality of laterally directed support members supported from an opposing pair of said frame members for supporting said connectors, said connectors being supported from adjacent pairs of said support members, a plurality of wiring ducts positioned on said support members, and a bus bar disposed within each wiring duct for connecting electrical energy to said connectors.

3. The assembly according to claim 2 wherein said bus bar comprises an elongated non-conductive member having a plurality of conductive strips positioned on opposing sides thereof, one of said conductive strips connected to ground potential at one end and connected to a plurality of said connectors along its length to provide a ground for the printed circuit cards mounted on said connectors, and the remaining conductive strips connected to said connectors and serving as voltage input leads.

References Cited by the Examiner

UNITED STATES PATENTS

| | | | |
|---|---|---|---|
| 516,862 | 3/94 | Frost | 317—99 |
| 2,799,837 | 7/57 | Powell | 317—101 |
| 2,921,607 | 1/60 | Caveney | 174—72 |
| 3,001,102 | 9/61 | Stiefel et al. | 317—101 |
| 3,001,171 | 9/61 | Schultz | 317—101 |
| 3,008,113 | 11/61 | Johnson | 317—101 |
| 3,015,755 | 1/62 | Wright | 317—101 |
| 3,061,182 | 10/62 | Corrado et al. | 339—17 |
| 3,105,869 | 10/63 | Branch et al. | 317—101 |

FOREIGN PATENTS

| | | |
|---|---|---|
| 1,177,110 | 12/58 | France. |

OTHER REFERENCES

Tele-Tech and Electronic Industries, "U.S.C. Printed Card Connectors," December 1955, page 105.

H. H. Buggie, Inc., Catalogue, Jan. 8, 1954, page 3.

JOHN F. BURNS, *Primary Examiner.*